(12) United States Patent
Rigano et al.

(10) Patent No.: US 11,888,068 B2
(45) Date of Patent: Jan. 30, 2024

(54) INTEGRATED TRANSISTORS HAVING GATE MATERIAL PASSING THROUGH A PILLAR OF SEMICONDUCTOR MATERIAL, AND METHODS OF FORMING INTEGRATED TRANSISTORS

(71) Applicant: Micron Technology, Inc., Boise, ID (US)

(72) Inventors: Antonino Rigano, Cernusco sul Naviglio (IT); Marcello Mariani, Milan (IT)

(73) Assignee: Micron Technology, Inc., Boise, ID (US)

( * ) Notice: Subject to any disclaimer, the term of this patent is extended or adjusted under 35 U.S.C. 154(b) by 98 days.

(21) Appl. No.: 17/502,546

(22) Filed: Oct. 15, 2021

(65) Prior Publication Data
US 2022/0037533 A1 Feb. 3, 2022

Related U.S. Application Data

(62) Division of application No. 16/526,074, filed on Jul. 30, 2019, now Pat. No. 11,177,389.

(51) Int. Cl.
*H01L 29/786* (2006.01)
*H01L 29/66* (2006.01)
(Continued)

(52) U.S. Cl.
CPC .... *H01L 29/78642* (2013.01); *G11C 11/2257* (2013.01); *G11C 11/4085* (2013.01);
(Continued)

(58) Field of Classification Search
CPC ......... H01L 29/78642; H01L 29/78391; G11C 11/00–2275; G11C 11/4085; H01B 12/00
See application file for complete search history.

(56) References Cited

U.S. PATENT DOCUMENTS 9,634,011 B2 4/2017 Kang et al.
10,332,983 B1 6/2019 Cheng et al.
(Continued)

FOREIGN PATENT DOCUMENTS

KR 10-2016-0126147 11/2016

OTHER PUBLICATIONS

WO PCT/US2020/042412 Search Rept, dated Nov. 5, 2020, Micron Technology, Inc.
(Continued)

*Primary Examiner* — Suberr L Chi
(74) *Attorney, Agent, or Firm* — Wells St. John P.S.

(57) ABSTRACT

Some embodiments include an integrated assembly having a pillar of semiconductor material. The pillar has a base region, and bifurcates into two segments which extend upwardly from the base region. The two segments are horizontally spaced from one another by an intervening region. A conductive gate is within the intervening region. A first source/drain region is within the base region, a second source/drain region is within the segments, and a channel region is within the segments. The channel region is adjacent to the conductive gate and is vertically disposed between the first and second source/drain regions. Some embodiments include methods of forming integrated assemblies.

20 Claims, 18 Drawing Sheets

(51) Int. Cl.

| | |
|---|---|
| *H01L 27/12* | (2006.01) |
| *H01L 29/423* | (2006.01) |
| *H01L 29/49* | (2006.01) |
| *H01L 29/51* | (2006.01) |
| *H01L 29/78* | (2006.01) |
| *G11C 11/22* | (2006.01) |
| *G11C 11/408* | (2006.01) |
| *H01L 21/28* | (2006.01) |
| *H10B 12/00* | (2023.01) |
| *H10B 51/30* | (2023.01) |
| *H10B 51/40* | (2023.01) |
| *H10B 53/30* | (2023.01) |
| *H10B 53/40* | (2023.01) |

(52) U.S. Cl.
CPC ......... *H01L 27/124* (2013.01); *H01L 27/127* (2013.01); *H01L 27/1222* (2013.01); *H01L 27/1255* (2013.01); *H01L 29/40111* (2019.08); *H01L 29/42392* (2013.01); *H01L 29/4908* (2013.01); *H01L 29/516* (2013.01); *H01L 29/6684* (2013.01); *H01L 29/66742* (2013.01); *H01L 29/78391* (2014.09); *H01L 29/78618* (2013.01); *H01L 29/78651* (2013.01); *H10B 12/0335* (2023.02); *H10B 12/315* (2023.02); *H10B 12/50* (2023.02); *H10B 51/30* (2023.02); *H10B 51/40* (2023.02); *H10B 53/30* (2023.02); *H10B 53/40* (2023.02)

(56) References Cited

U.S. PATENT DOCUMENTS

| | | |
|---|---|---|
| 2009/0072291 A1 | 3/2009 | Takaishi |
| 2010/0295106 A1 | 11/2010 | Huang |
| 2012/0302052 A1* | 11/2012 | Mariani ............... H10N 70/231 438/666 |
| 2015/0262621 A1 | 9/2015 | Mou et al. |
| 2018/0218765 A1 | 8/2018 | Demer et al. |
| 2018/0374855 A1 | 12/2018 | Pandey et al. |
| 2019/0165103 A1 | 5/2019 | Lu et al. |

OTHER PUBLICATIONS

WO PCT/US2020/042412 Writ. Opin, dated Nov. 5, 2020, Micron Technology, Inc.
WO PCT/US2020/042412 IPRP, dated Feb. 1, 2022, Micron Technology, Inc.

* cited by examiner

INTEGRATED TRANSISTORS HAVING GATE MATERIAL PASSING THROUGH A PILLAR OF SEMICONDUCTOR MATERIAL, AND METHODS OF FORMING INTEGRATED TRANSISTORS

RELATED PATENT DATA

This patent resulted from a divisional of U.S. patent application Ser. No. 16/526,074 filed Jul. 30, 2019, which is hereby incorporated by reference herein.

TECHNICAL FIELD

Integrated assemblies (e.g., memory arrays). Integrated assemblies having transistors with gate material passing through pillars of semiconductor material. Methods of forming integrated assemblies.

BACKGROUND

Memory is one type of integrated circuitry, and is used in computer systems for storing data. An example memory is DRAM (dynamic random-access memory). DRAM cells may each comprise a transistor in combination with a capacitor. The DRAM cells may be arranged in an array; with wordlines extending along rows of the array, and digit lines extending along columns of the array. The wordlines may be coupled with the transistors of the memory cells. Each memory cell may be uniquely addressed through a combination of one of the wordlines with one of the digit lines.

A continuing goal is to increase the level of integration of integrated circuitry, with a related goal being to increase packing density of integrated circuit components. It is desired to develop new DRAM architectures which are scalable to high levels of integration, and to develop methods for fabricating such DRAM architectures.

DETAILED DESCRIPTION OF THE ILLUSTRATED EMBODIMENTS

Some embodiments include assemblies having integrated transistors with conductive gate material extending through a pillar of semiconductor material. The integrated transistors may be incorporated into memory arrays (e.g., DRAM arrays). Some embodiments include methods of forming the integrated transistors. Example embodiments are described with reference to FIGS. 1-16.

Figure 1:
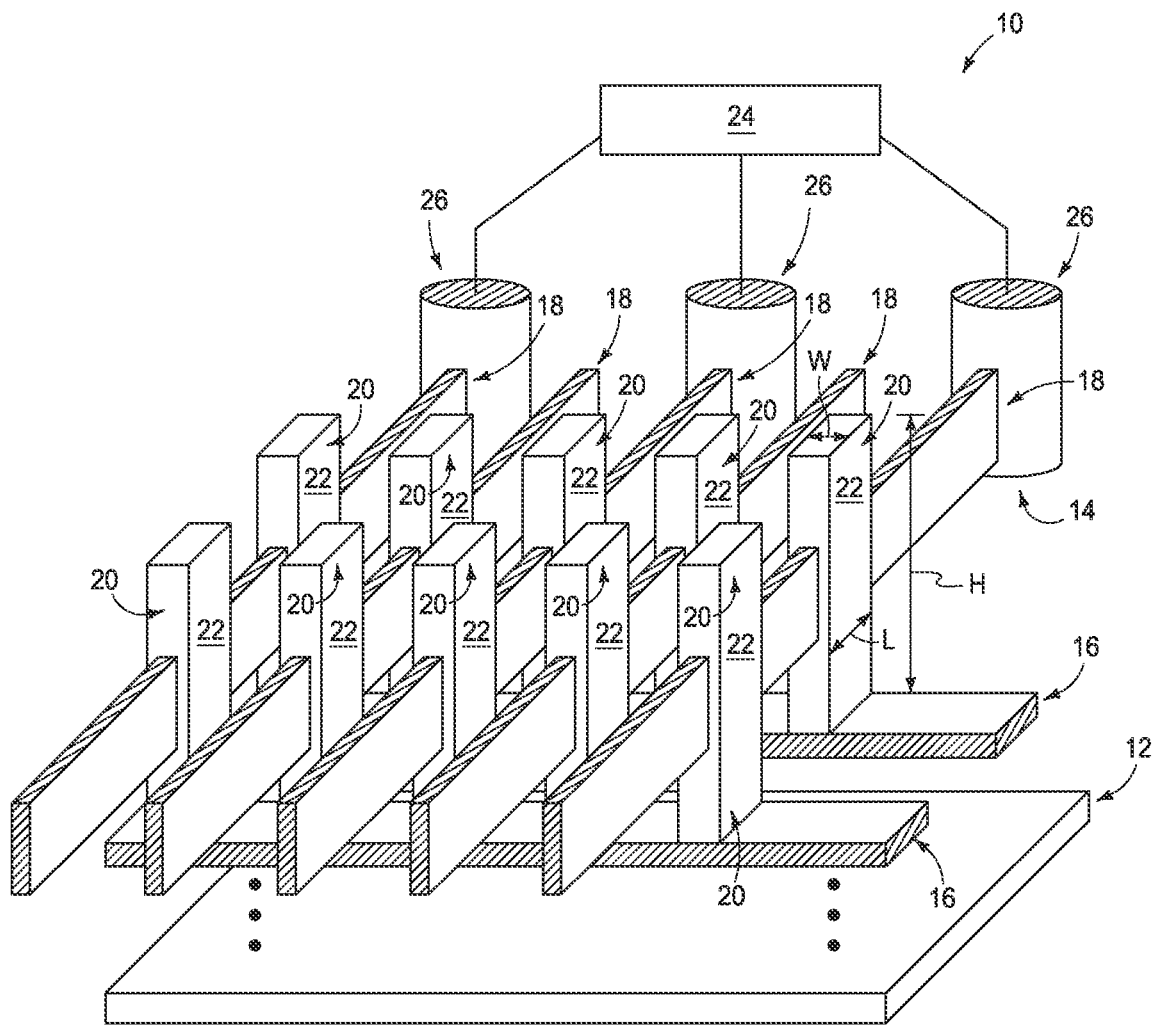
FIG. 1 is a diagrammatic three-dimensional view of a region of an example memory array.

Referring to FIG. 1, an integrated assembly 10 includes a memory array 14 supported over a base 12.

The base 12 may comprise semiconductor material; and may, for example, comprise, consist essentially of, or consist of monocrystalline silicon. The base 12 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base and the memory array 14 to indicate that other materials and components may be formed between the base 12 and the memory array 14. For instance, the memory array may be supported by an insulative material (not shown).

The memory array 14 includes digit lines (bitlines, sense lines) 16 which extend along a first direction represented by a y-axis, and includes wordlines (access lines) 18 which extend along a second direction represented by an x-axis. In some embodiments the wordlines 18 may be considered to extend along a row direction of the memory array 14, and the digit lines 16 may be considered to extend along a column direction of the memory array. One of the x and y axis directions may be referred to as a first horizontal direction, and the other may be referred to as a second horizontal direction; with the first horizontal direction crossing (intersecting) the second horizontal direction. In the illustrated embodiment the first horizontal direction (the direction of either the x-axis or the y-axis) is substantially orthogonal to the second horizontal direction (the direction of the other of the x-axis and the y-axis); with the term "substantially orthogonal" meaning orthogonal to within reasonable tolerances of fabrication and measurement.

The digit lines 16 and the wordlines 18 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The digit lines 16 and the wordlines 18 may comprise a same composition as one another, or may comprise different compositions relative to one another.

Pillars 20 extend upwardly from the digit lines 16. The pillars comprise semiconductor material 22. The semiconductor material 22 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 22 may comprise, consist essentially of, or consist of silicon.

The pillars 20 extend vertically along a z-axis direction; with the z-axis direction being shown to be substantially orthogonal to both the x-axis direction and the y-axis direction.

The pillars 20 may have any suitable dimensions; and in some embodiments may have heights, H, within a range of from about 100 nanometers (nm) to about 300 nm; widths, W, within a range of from about 5 nm to about 30 nm (and in some embodiments less than or equal to about 25 nm); and lengths, L, within a range of from about 5 nm to about 30 nm (and in some embodiments less than or equal to about 25 nm). The widths, W, may be equal to the lengths, L, or may be different than the lengths.

The wordlines 18 are diagrammatically illustrated to pass through central regions of the pillars 20 (with the term "central region of a pillar" meaning a region interior to the pillar, which may or may not be centered relative to the pillar). In some embodiments each of the pillars 20 is incorporated into an integrated transistor. The wordlines comprise gate regions within the pillars, and are utilized to operate the integrated transistors. The transistors may be ferroelectric transistors or non-ferroelectric transistors, as will be discussed in more detail below.

If the transistors are ferroelectric transistors, they may be utilized as memory cells within a memory array.

If the transistors are non-ferroelectric transistors, they may be utilized as access transistors within a memory array. Storage-elements (e.g. capacitors) may be coupled with the access transistors, and may be utilized within memory cells of the memory array (e.g., a DRAM array). Example storage-elements are described in more detail below.

FIG. 1 diagrammatically illustrates some of the wordlines being electrically coupled with driver circuitry (e.g., CMOS) 24 through connections 26 at ends of the wordlines. An advantage of having the wordlines passing through the central regions of the semiconductor pillars 20 is that such may provide more space between neighboring wordlines than would be available in conventional configurations (in which the wordlines pass along edges of semiconductor pillars, rather than passing through the semiconductor pillars), which may simplify the fabrication of the connections 26; and which may otherwise improve scalability of the memory array 14 as compared to conventional configurations of analogous memory arrays.

Figure 2A:
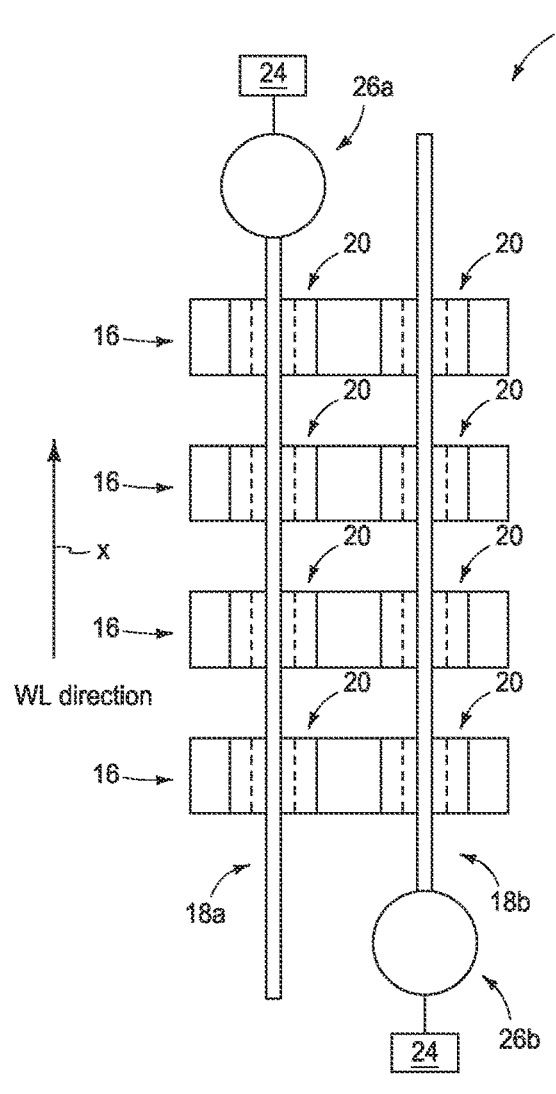
FIGS. 2A and 2B are diagrammatic top views of regions of example memory arrays.
Figure 2B:
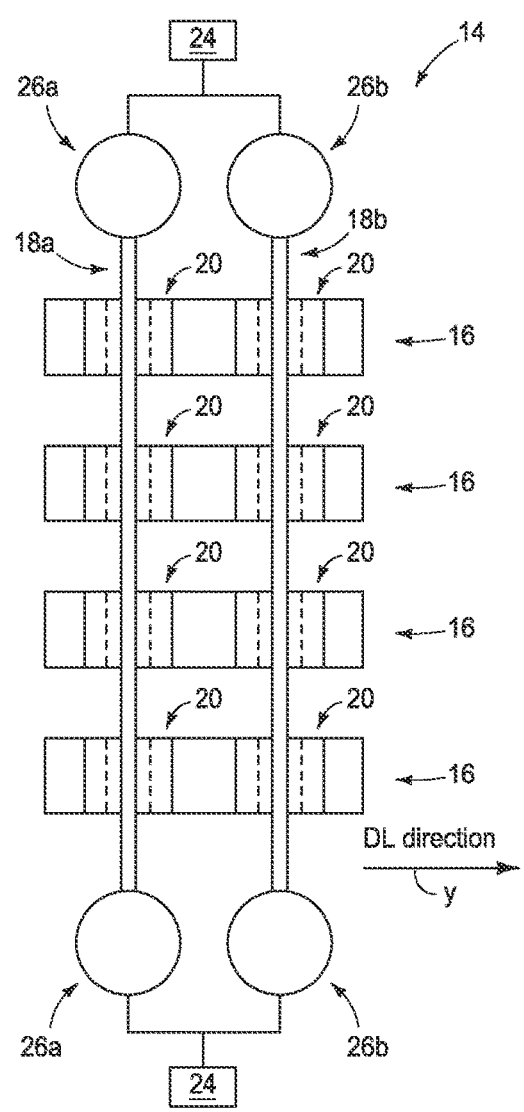

FIGS. 2A and 2B show the memory array 14 in a pair of example configurations.

The configuration of FIG. 2A shows neighboring wordlines 18a and 18b being coupled with connections 26a and 26b, respectively, with such connections being coupled to the driver circuitry 24. The connections 26a and 26b are at ends of the wordlines 18a and 18b, and are offset relative to one another along the row-axis direction (x-axis direction, wordline (WL) direction). The offset connections 26a and 26b may be at the same ends of the neighboring wordlines 18a and 18b as one another, or may be at opposite ends of the neighboring wordlines relative to one another (as shown).

The configuration of FIG. 2B shows the connections 26a and 26b being directly adjacent to one another relative to the row-axis direction, and being offset only along the column-axis direction (y-axis direction, digit line (DL) direction). In the illustrated embodiment of FIG. 2B, the connections 26a and 26b are at both ends of the wordlines 18a and 18b. In other embodiments, the connections 26a and 26b may be at only one end of the wordlines. Regardless, FIG. 2B illustrates an advantage which may be achieved utilizing memory configurations described herein as compared to conventional configurations. Specifically, passage of the wordlines 18 through the semiconductor pillars 20 may enable wider spacing between the wordlines than is achieved when the wordlines pass along edges of the semiconductor pillars in conventional configurations. Such may enable the connections 26a and 26b to be directly adjacent one another in highly-integrated memory configurations described herein even though such would not be possible in conventional memory configurations at similar levels of integration.

The memory array 14 may be formed with any suitable processing. Example processing is described with reference to FIGS. 3-12.

Figure 3A:
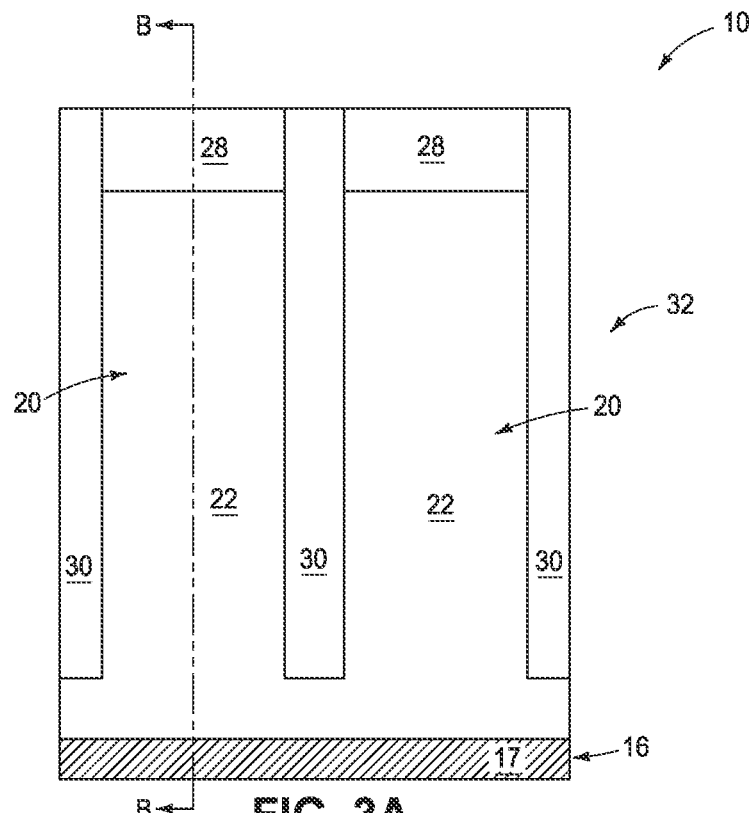
FIGS. 3A and 3B are diagrammatic cross-sectional side views of regions of an example integrated assembly at a process stage of an example method. The view of FIG. 3A is along the line A-A of FIG. 3B, and the view of FIG. 3B is along the line B-B of FIG. 3A.
Figure 3B:
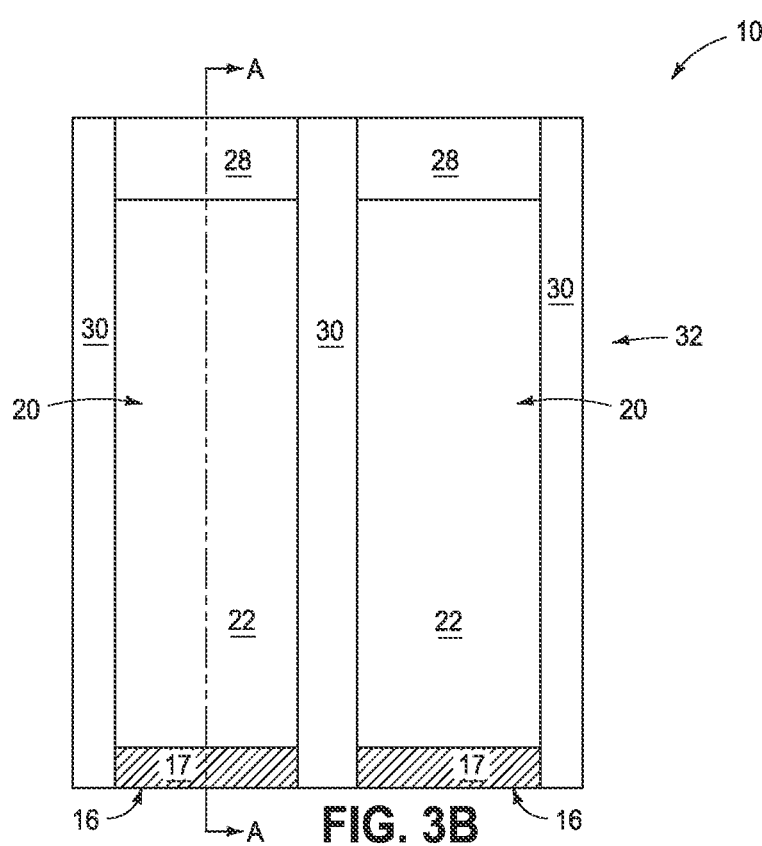

Referring to FIGS. 3A and 3B, the assembly 10 is illustrated at a process stage after semiconductor material 22 is formed over the digit lines 16. The views of FIGS. 3A and 3B are orthogonal to one another; with the view of FIG. 3A being along the line A-A of FIG. 3B, and the view of FIG. 3B being along the line B-B of FIG. 3A. The view of FIG. 3A may be considered to be along a direction corresponding to the y-axis of FIG. 1, and the view of FIG. 3B may be considered to be along a direction corresponding to the x-axis of FIG. 1.

The digit lines 16 are shown to comprise conductive digit line material 17. Such digit line material may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the digit line material 17 may comprise metal (e.g., tungsten, titanium, etc.) and/or one or more metal-containing compositions (e.g., titanium nitride, tungsten nitride, titanium silicide, tungsten silicide, etc.).

The semiconductor material 22 is patterned into the pillars 20, with such pillars extending upwardly from the digit lines 16.

Protective material 28 is over tops of the pillars 20. The protective material 28 may comprise any suitable composition(s); and in some embodiments may comprise, consist essentially of, or consist of silicon dioxide.

An insulative material 30 laterally surrounds the pillars 20. The insulative material 30 may comprise any suitable composition(s); and in some embodiments may comprise, consist essentially of, or consist of silicon dioxide. The insulative material 30 may correspond to a spin-on dielectric (SOD).

In some embodiments the configuration of FIGS. 3A and 3B may be considered to comprise a mass 32 extending across the digit lines 16; with such mass including the semiconductor pillars 20, and the materials 28 and 30 surrounding the pillars.

The base 12 (FIG. 1) is not shown in FIGS. 3A and 3B in order to simplify the drawings, but would generally be present under the digit lines 16.

Figure 4A:
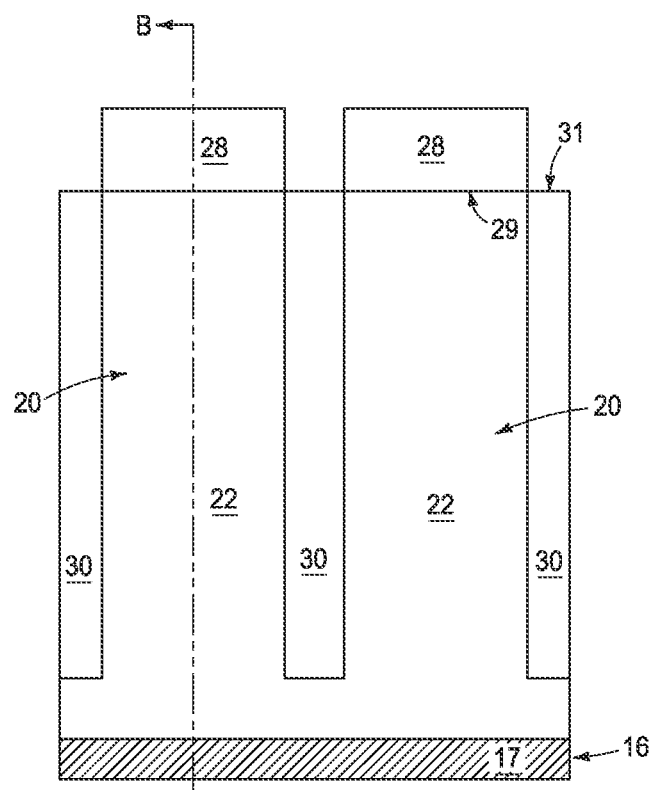
FIGS. 4A and 4B are diagrammatic cross-sectional side views of regions of the example integrated assembly of FIGS. 3A and 3B at an example process stage subsequent to that of FIGS. 3A and 3B. The view of FIG. 4A is along the line A-A of FIG. 4B, and the view of FIG. 4B is along the line B-B of FIG. 4A.
Figure 4B:
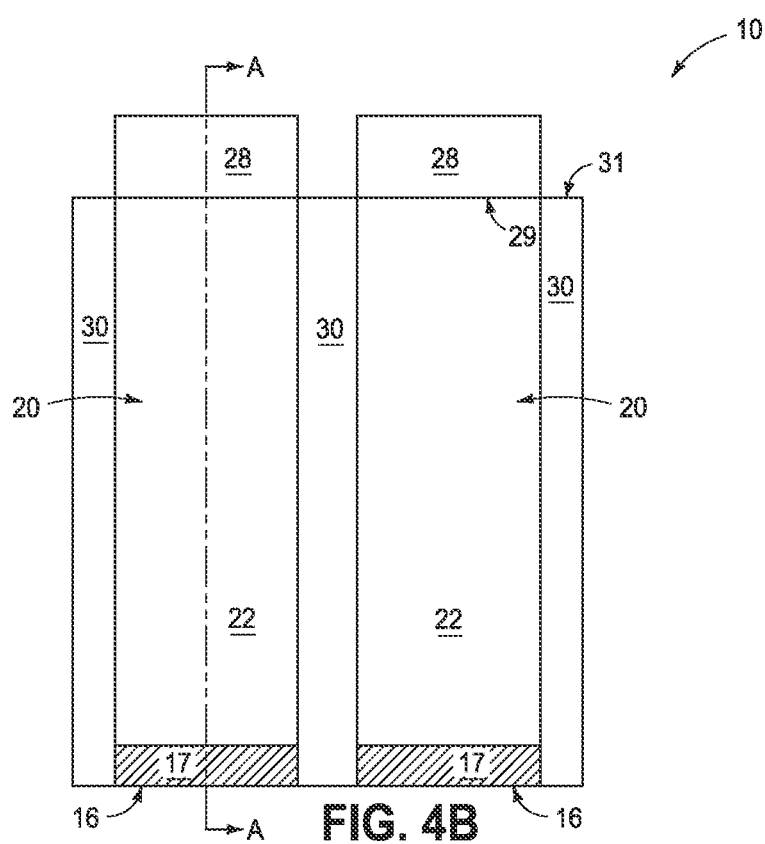

Referring to FIGS. 4A and 4B, the insulative material 30 is recessed relative to the protective material 28. In the illustrated embodiment an upper surface 31 of the insulative material 30 is coextensive with a bottom surface 29 of the protective material 28 after the recessing of the material 30.

Figure 5A:
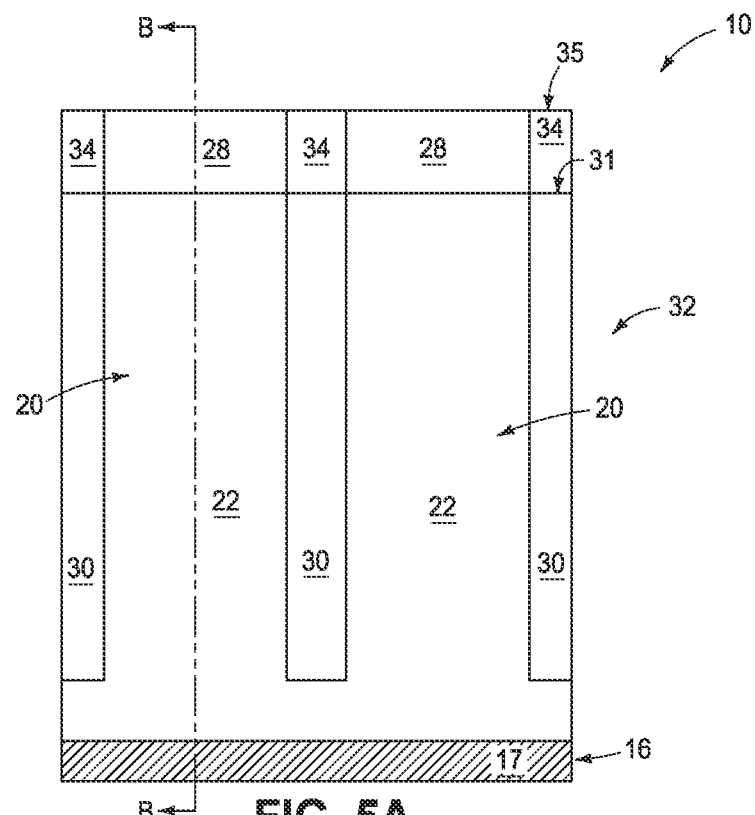
FIGS. 5A and 5B are diagrammatic cross-sectional side views of regions of the example integrated assembly of FIGS. 3A and 3B at an example process stage subsequent to that of FIGS. 4A and 4B. The view of FIG. 5A is along the line A-A of FIG. 5B, and the view of FIG. 5B is along the line B-B of FIG. 5A.
Figure 5B:
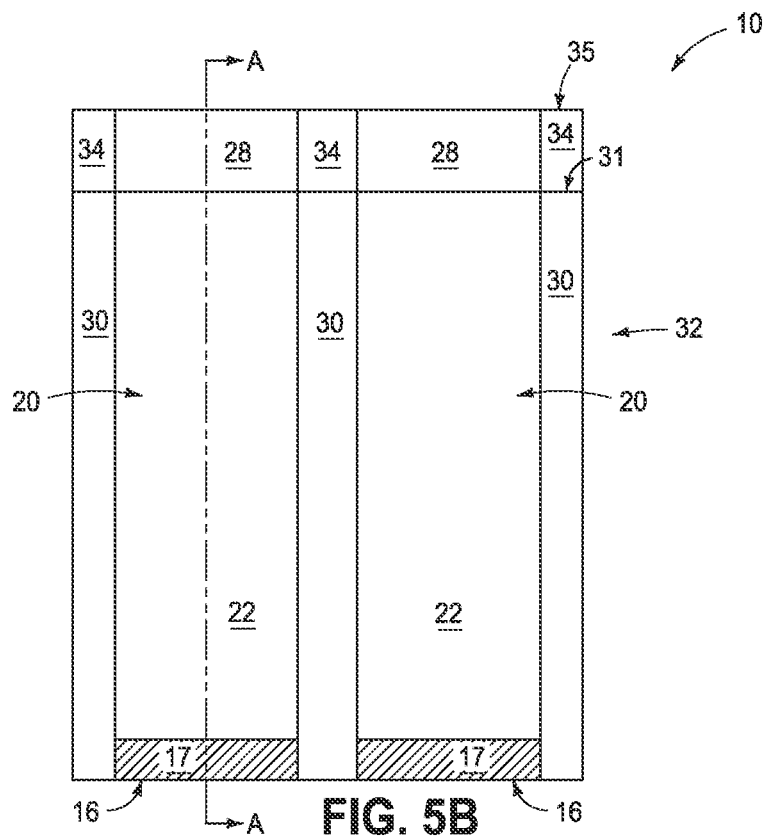

Referring to FIGS. 5A and 5B, a second protective material 34 is formed over the upper surface 31 of the recessed material 30, and adjacent to the first protective material 28. The second protective material 34 may comprise any suitable composition(s); and in some embodiments may comprise, consist essentially of, or consist of a material comprising silicon and carbon (e.g., a silicon carbide). In the illustrated embodiment a planarized surface 35 is formed to extend across the first and second protective materials 28 and 34. The planarized surface 35 may be formed with any suitable processing; including, for example, chemical-mechanical polishing (CMP).

The materials 22, 30, 28 and 34 may be together considered to be incorporated into the mass 32 which extends across the digit lines 16.

Figure 6A:
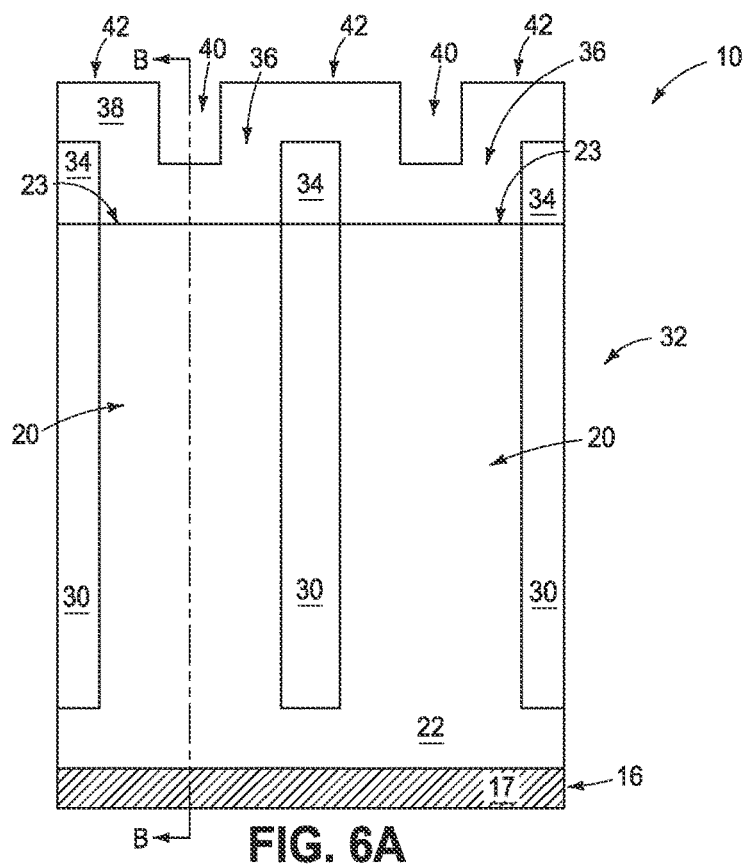
FIGS. 6A and 6B are diagrammatic cross-sectional side views of regions of the example integrated assembly of FIGS. 3A and 3B at an example process stage subsequent to that of FIGS. 5A and 5B. The view of FIG. 6A is along the line A-A of FIG. 6B, and the view of FIG. 6B is along the line B-B of FIG. 6A.
Figure 6B:
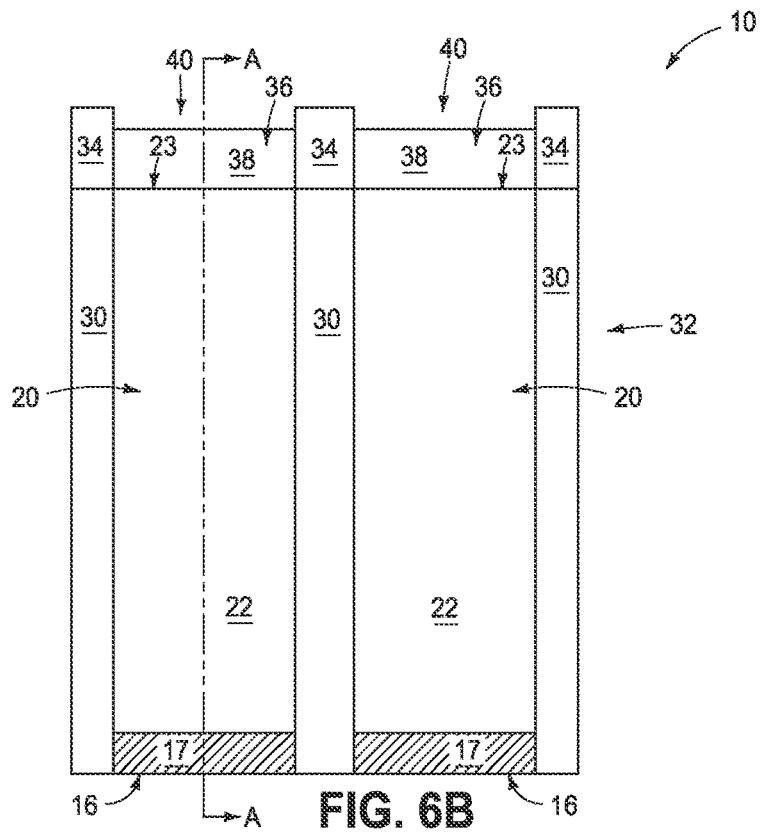

Referring to FIGS. 6A and 6B, the first protective material 28 (FIGS. 5A and 5B) is removed to form openings 36 extending into the mass 32. The openings 36 are directly over the semiconductor pillars 22, and expose upper surfaces 23 of the semiconductor pillars.

A material 38 is formed over the mass 32. The material 38 may comprise any suitable composition(s); and in some embodiments may comprise, consist essentially of, or consist of silicon nitride.

The material 38 is conformal to a top surface of the mass 32, and extends into the openings 36. An upper topography of the material 38 has valleys 40 over the semiconductor pillars 20, and has peaks 42 between the valleys. In some embodiments the material 38 may be referred to as a patterned material to indicate that the material has the patterned topography comprising the illustrated peaks 42 and valleys 40.

Figure 7A:
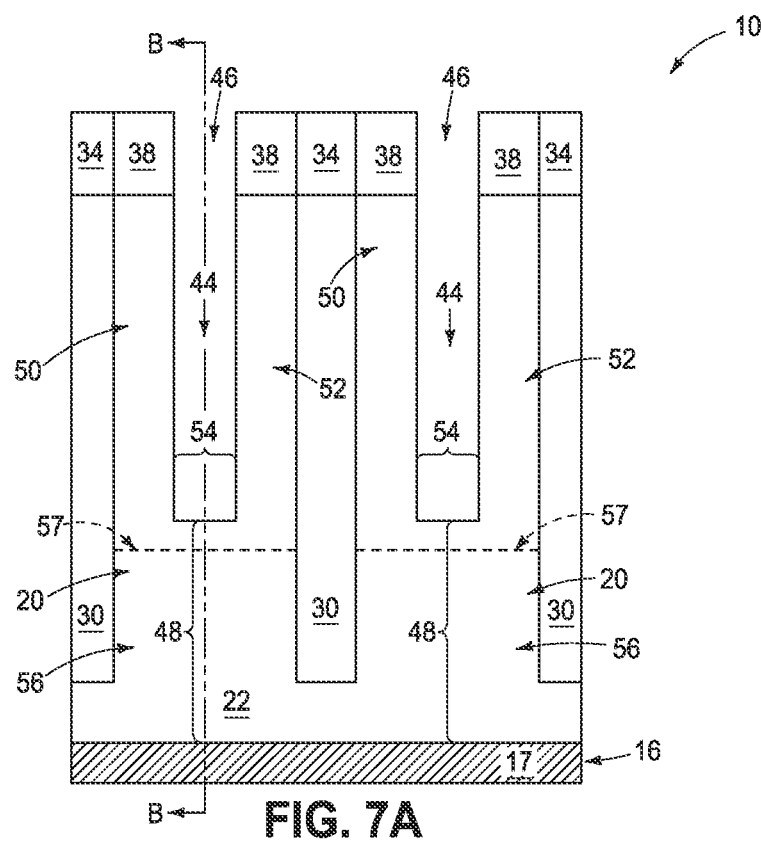
FIGS. 7A and 7B are diagrammatic cross-sectional side views of regions of the example integrated assembly of FIGS. 3A and 3B at an example process stage subsequent to that of FIGS. 6A and 6B. The view of FIG. 7A is along the line A-A of FIG. 7B, and the view of FIG. 7B is along the line B-B of FIG. 7A.
Figure 7B:
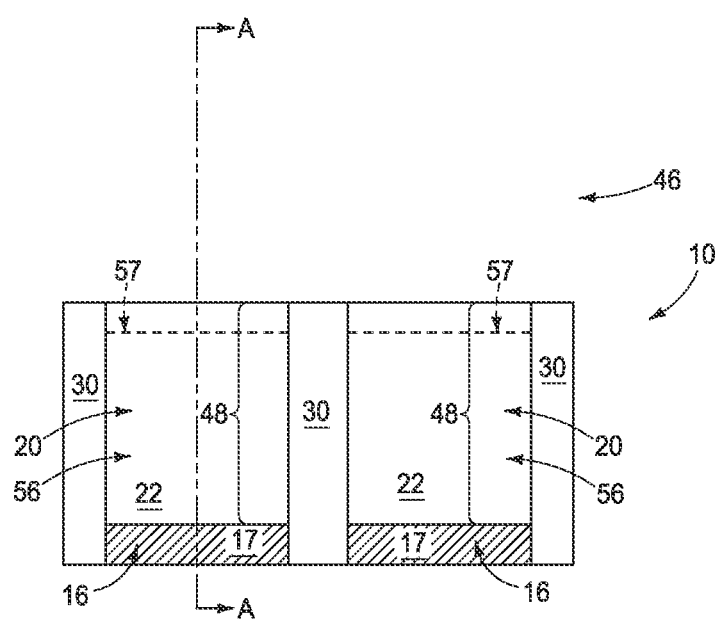

Referring to FIGS. 7A and 7B, the valleys 40 (FIGS. 6A and 6B) are extended into the semiconductor pillars 20 form openings 44 in the semiconductor pillars. In the illustrated embodiment such openings are incorporated into slits 46 which extend into the page relative to the cross-section of FIG. 7A, and which extend along the cross-section of FIG. 7B. The utilization of the openings 44 may assist in aligning the slits 46 with central regions of the pillars 20. However, the slits 46 may be patterned with any suitable processing. For instance, the slits 46 may correspond to trenches patterned utilizing a photolithographically-patterned photoresist mask (not shown) in addition to, or alternatively to, the formation of the openings 46 with the conformal material 38.

Each of the patterned pillars 20 includes a base region 48, and a pair of segments (projections) 50 and 52 extending upwardly from the base region. In some embodiments the pillars 20 may be considered to extend vertically from upper surfaces of the digit lines 16; to comprise the base regions 48 directly over the digit lines; and to bifurcate into the first and second segments 50 and 52 which extend upwardly from the base region.

The first and second segments 50 and 52 are horizontally-spaced from one another by intervening regions (gaps) 54. In some embodiments each of the patterned pillars 20 may be considered to have a slit 46 associated therewith, and to have an intervening gap 54 corresponding to the associated slit.

In the shown embodiment lower regions of the pillars 20 are conductively doped to form first source/drain regions 56 within the lower regions. Approximate upper boundaries of the first source/drain regions are diagrammatically illustrated utilizing dashed lines 57. The upper boundaries of the source/drain regions 56 may be at any suitable locations within the pillars 20, and may be above or below the illustrated locations 57 in some embodiments.

The source/drain regions 56 may be formed at any suitable process stage, including processing stages prior to FIGS. 7A and 7B (such as, for example, blanket doping prior to the process stage of FIGS. 3A and 3B). However, it may be advantageous to form the source/drain regions 56 at the process stage of FIGS. 7A and 7B as such may enable the source/drain regions to be aligned with the semiconductor pillars 20.

Figure 8A:
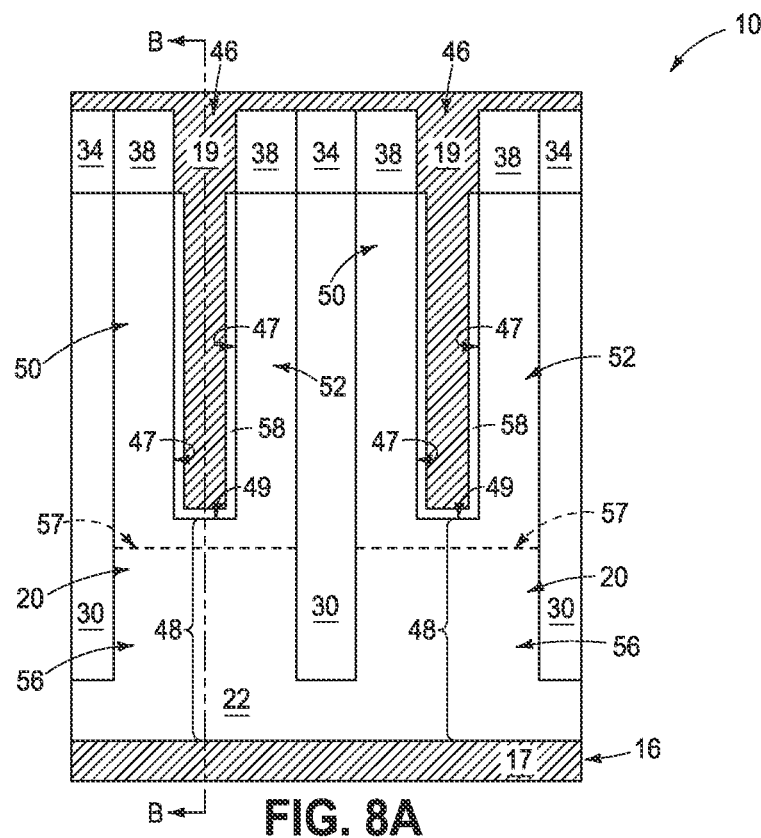
FIGS. 8A and 8B are diagrammatic cross-sectional side views of regions of the example integrated assembly of FIGS. 3A and 3B at an example process stage subsequent to that of FIGS. 7A and 7B. The view of FIG. 8A is along the line A-A of FIG. 8B, and the view of FIG. 8B is along the line B-B of FIG. 8A.
Figure 8B:
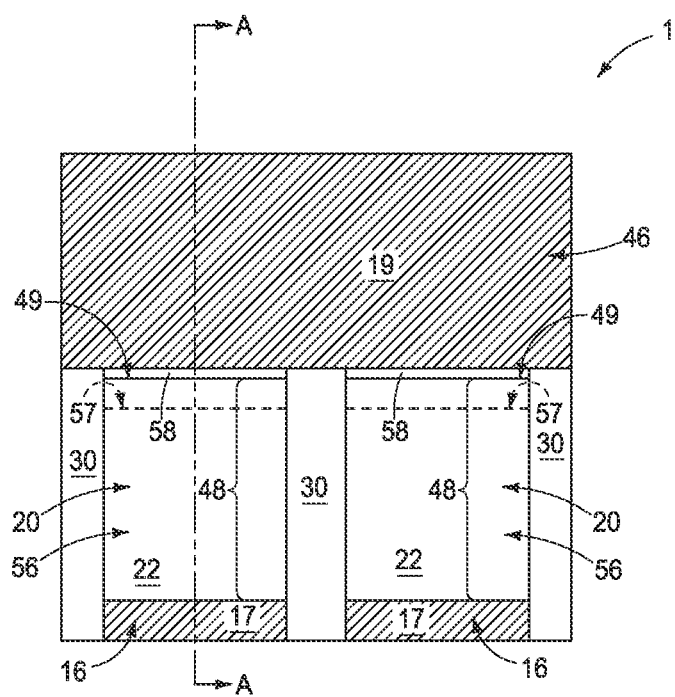

Referring to FIGS. 8A and 8B, insulative material 58 is formed along sidewalls 47 of the slits 46; and in the shown embodiment is also formed along bottoms 49 of the slits. The insulative material 58 may be referred to as a first insulative material to distinguish it from other insulative materials that may also be formed within the slits 46. In some embodiments the insulative material 58 may be referred to as gate dielectric material.

The insulative material 58 may comprise any suitable composition(s); and in some embodiments may comprise silicon dioxide and/or one or more high-k dielectric materials (where the term high-k means a dielectric constant greater than that of silicon dioxide). Example high-k dielectric materials include aluminum oxide, hafnium oxide, zirconium oxide, etc.

In some embodiments, the insulative material 58 may comprise ferroelectric material suitable for utilization in ferroelectric transistors. The ferroelectric material may comprise any suitable composition(s); and may, for example, comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, strontium, and a rare earth element. The ferroelectric material may be provided in any suitable configuration; such as, for example, a single homogeneous material, or a laminate of two or more discrete separate materials.

In some embodiments, the insulative material 58 may consist of non-ferroelectric material (e.g., silicon dioxide).

The insulative material 58 may be oxidatively grown from the semiconductor material 22 of the semiconductor pillars 20. For instance, if the semiconductor material 22 comprises silicon, the insulative material 58 may comprise, consist essentially of, or consist of silicon dioxide which is oxidatively grown from such semiconductor material.

The insulative material 58 may be deposited along the sidewalls 47 and bottoms 49 of the slits 46 in addition to, or alternatively to, being oxidatively grown. Such deposition may utilize any suitable processing; including, for example, atomic layer deposition (ALD), chemical vapor deposition (CVD), etc.

FIG. 8A shows an embodiment in which the material 58 is selectively formed along the surfaces 47 and 49 of the semiconductor material 22 relative to surfaces of the materials 34 and 38. Such may be accomplished with selective deposition of the material 58 and/or by oxidatively growing material 58 from exposed surfaces of the semiconductor material 22. In other embodiments (discussed below), the material 58 may be formed along surfaces of the materials 34 and 38, in addition to being formed along the surfaces of the semiconductor material 22.

Conductive material 19 is formed within the slits 46 and adjacent to (over) the insulative material 58. The conductive material 19 is ultimately utilized to form the wordlines 18, and may be referred to as wordline material. The conductive material 19 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 19 may comprise one or more metals (e.g., tungsten, titanium, etc.); and/or one or more metal-containing compositions (e.g., metal nitride, metal carbide, metal silicide, etc.). The wordline material 19 may be the same composition as the digit line material 17, or may be a different composition relative to the digit line material.

An upper surface of the wordline material 19 may be planarized to remove some of the excess material 19.

Figure 8C:
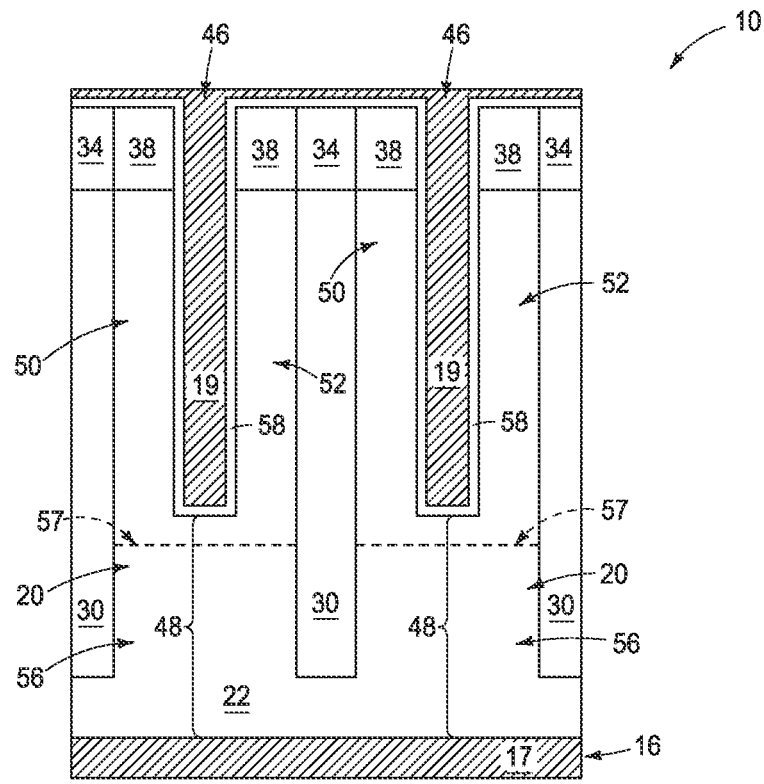
FIGS. 8C and 8D are diagrammatic cross-sectional side views of regions of the example integrated assembly of FIG. 3A at example process stages subsequent to that of FIG. 7A and alternative to that of FIG. 8A.
Figure 8D:
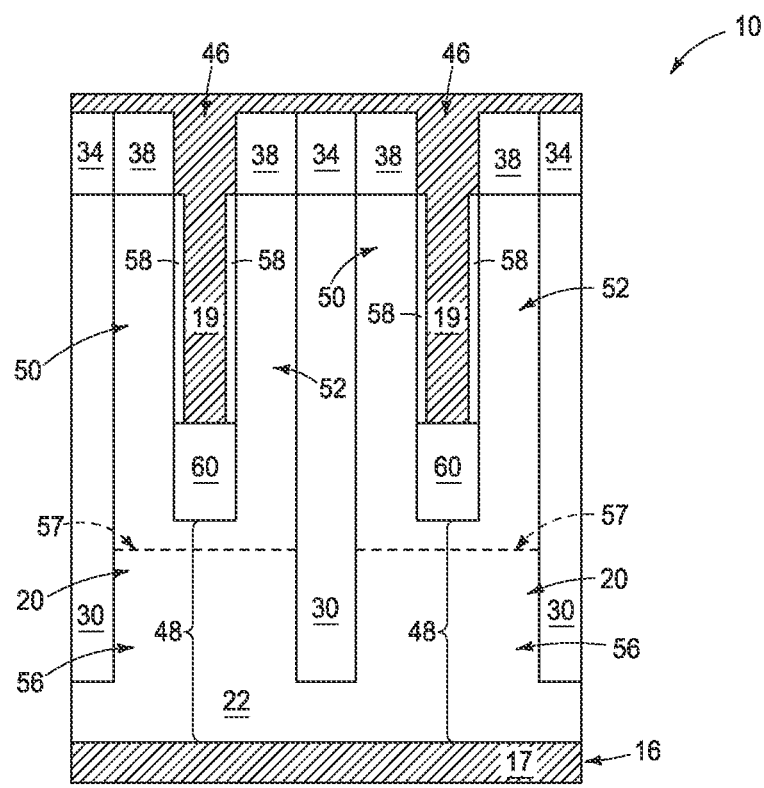

FIGS. 8C and 8D show processing stages which may be utilized alternatively to the process stage of FIG. 8A.

FIG. 8C illustrates an embodiment in which the insulative material 58 is deposited along surfaces of all of the materials 22, 34 and 38, and then the conductive material 19 is formed within the slits 46 and over the insulative material 58.

FIG. 8D illustrates an embodiment in which another insulative material 60 is formed within the slits 46 prior to forming the insulative material 58 and the conductive material 46. The insulative material 60 may be referred to as a second insulative material to distinguish it from the first insulative material 58. The insulative material 60 may comprise any suitable composition(s); and in some embodiments may comprise, consist essentially of, or consist of silicon dioxide, low-k dielectric material and/or high-k dielectric material. The term "low-k" means a dielectric constant less than that of silicon dioxide. An example low-k dielectric material is porous silicon dioxide. In some embodiments the insulative material 60 may be a same composition as the insulative material 58, and in other embodiments the insulative material 60 may be a different composition than the insulative material 58.

The insulative material 60 may form a step which elevates the wordline material 19 to a desired location within the slits 46. Ultimately, the wordline material 19 is patterned into wordlines 18, and the insulative material 60 may be utilized to align such wordlines in a desired location relative to bottom portions of the projections 50 and 52 of the semiconductor pillars 20.

Although the insulative material 58 is shown to not extend across an upper surface of the insulative material 60 in the embodiment of FIG. 8D, it is to be understood that other embodiments similar to that of FIG. 8D may be formed in which the material 58 is deposited (analogously to the deposition shown in FIG. 8C) to extend across the upper surface of material 60, as well as across surfaces of the materials 34 and 38.

Figure 9A:
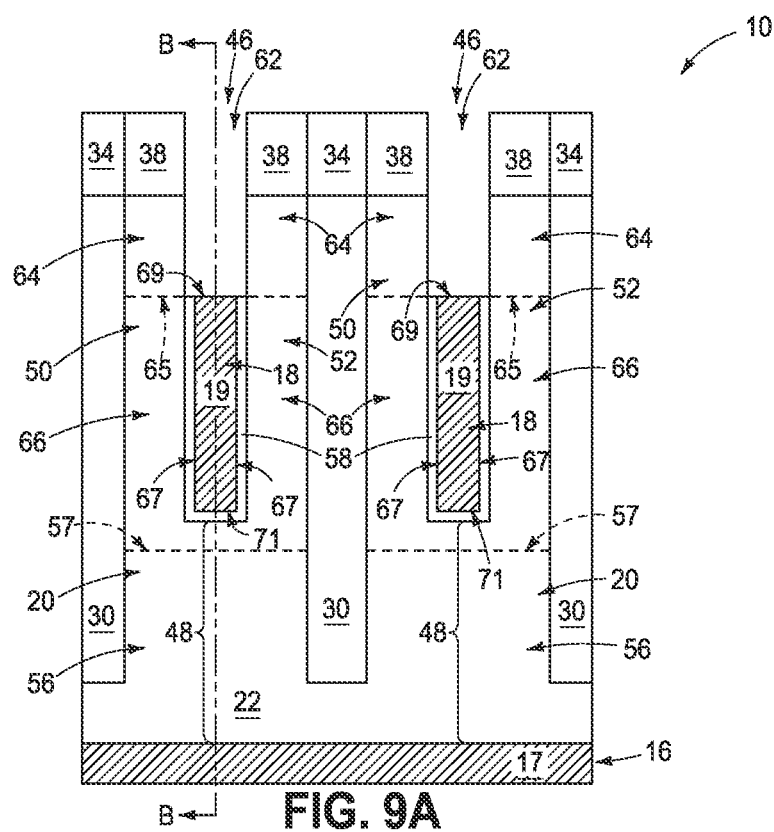
FIGS. 9A and 9B are diagrammatic cross-sectional side views of regions of the example integrated assembly of FIGS. 3A and 3B at an example process stage subsequent to that of FIGS. 8A and 8B. The view of FIG. 9A is along the line A-A of FIG. 9B, and the view of FIG. 9B is along the line B-B of FIG. 9A.
Figure 9B:
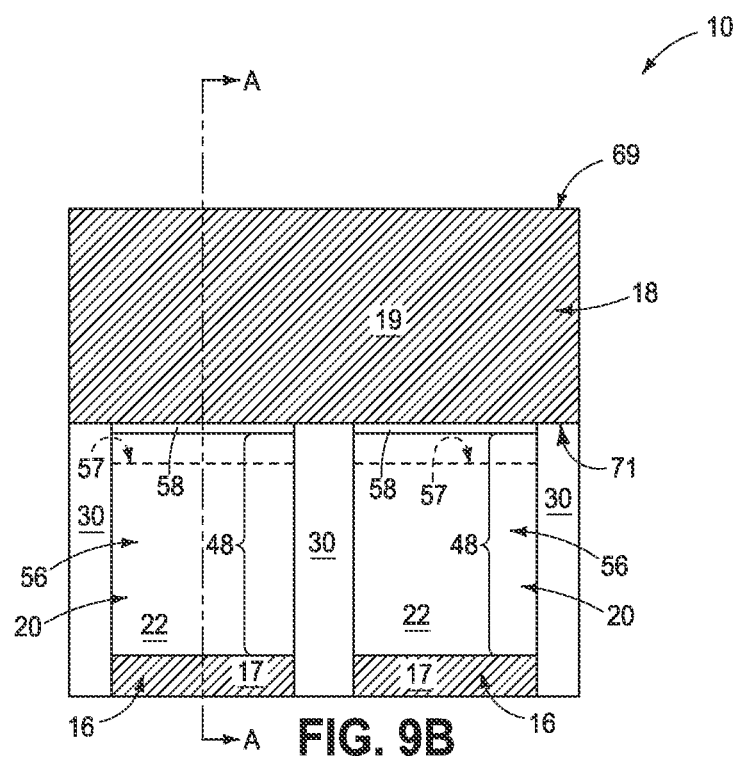

Referring to FIGS. 9A and 9B, the assembly 10 is shown at a processing stage subsequent to that of FIGS. 8A and 8B. The materials 19 and 58 are recessed within the slits 46 to form openings 62 within upper regions of the slits 46. The patterned material 19 becomes wordlines 18 analogous to those described above with reference to FIG. 1.

Second source/drain regions 64 are formed within the segments 50 and 52 of the semiconductor pillars 20. Approximate lower boundaries of the second source/drain regions are diagrammatically illustrated with dashed lines 65. The lower boundaries of the source/drain regions 64 may be at any suitable locations within the pillars 20, and may be above or below the illustrated locations 65 in some embodiments.

The source/drain regions 64 may be formed at any suitable process stage, including process stages prior to FIGS. 9A and 9B (such as, for example, blanket doping prior to the process stage of FIGS. 3A and 3B). However, it may be advantageous to form the source/drain regions 64 at the process stage of FIGS. 9A and 9B as such may enable the source/drain regions to be aligned with the semiconductor pillars 20 and with the upper surfaces of the wordlines 18.

Channel regions 66 are within the vertically-extending segments 50 and 52, and are vertically disposed between the lower source/drain regions 56 and the upper source/drain regions 64 (in some embodiments, the source/drain regions 56 and 64 may be considered to be vertically spaced from one another by the channel regions 66). The channel regions 66 may be doped to any suitable level with any suitable dopant (and in some embodiments may be intrinsically doped). The doping of the channel regions may occur at the processing stage of FIGS. 9A and 9B, and/or at another processing stage (e.g., utilizing blanket doping at the processing stage prior to that of FIGS. 3A and 3B).

In some embodiments the regions 56, 64 and 66 are incorporated into n-channel devices; and accordingly the source/drain regions 56 and 64 are n-type doped. In other embodiments the regions 56, 64 and 66 are incorporated into p-channel devices; and accordingly the source/drain regions 56 and 64 are p-type doped.

The wordlines 18 each have a pair of opposing sidewall surfaces 67, a top surface 69 and a bottom surface 71; with the sidewall surfaces extending between the top and bottom surfaces. Regions of the wordlines 18 within the pillars 20 may be utilized as gates of transistor devices; and may be referred to as gate regions, as transistor gates, or as transistor gate regions.

Figure 10A:
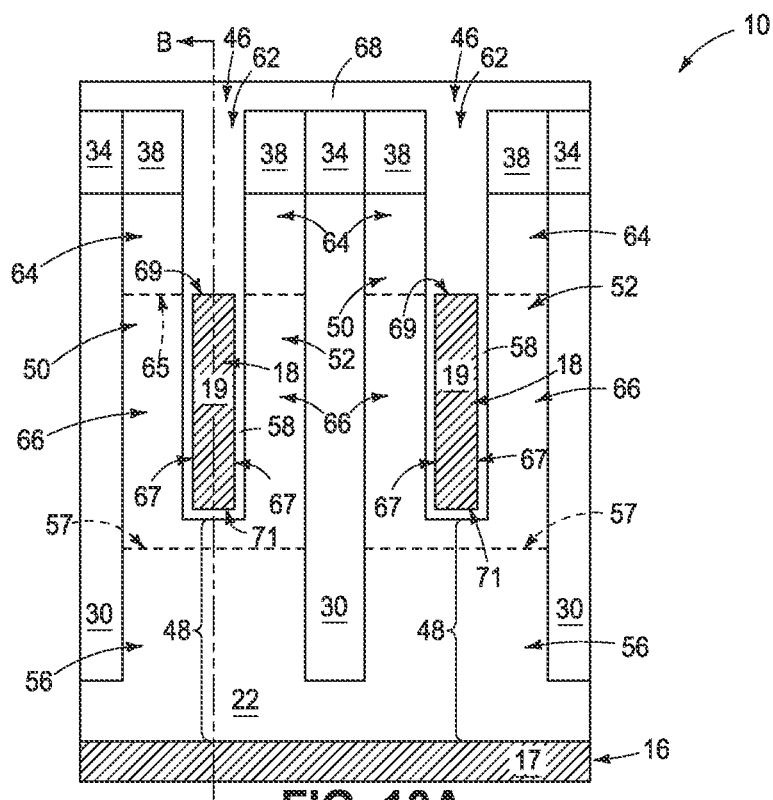
FIGS. 10A and 10B are diagrammatic cross-sectional side views of regions of the example integrated assembly of FIGS. 3A and 3B at an example process stage subsequent to that of FIGS. 9A and 9B. The view of FIG. 10A is along the line A-A of FIG. 10B, and the view of FIG. 10B is along the line B-B of FIG. 10A.
Figure 10B:
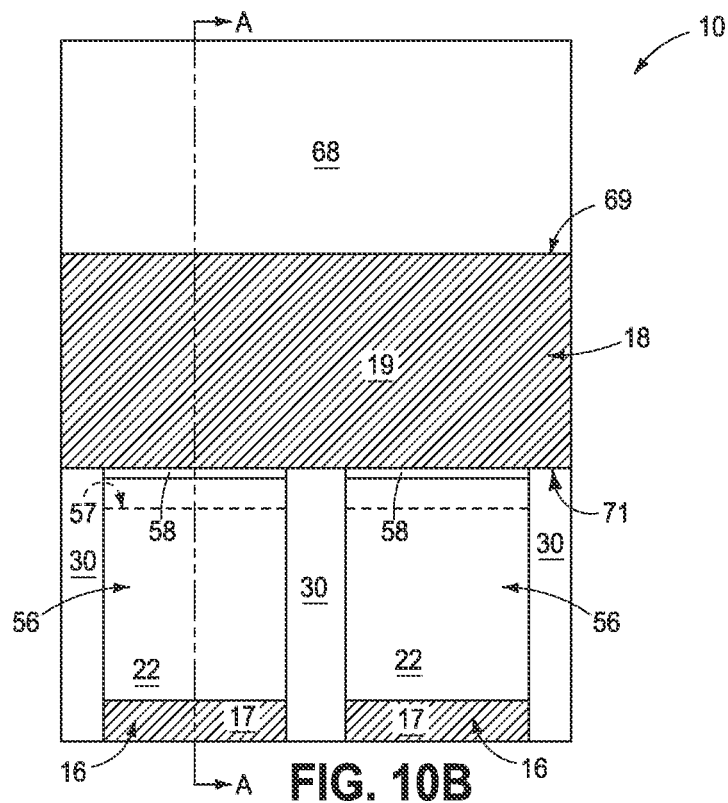

Referring to FIGS. 10A and 10B, insulative material 68 is formed within the opening 62 of the slits 46. The insulative material 68 is over the upper surfaces 69 of the wordlines 18. The insulative material 62 may comprise any suitable composition(s); and in some embodiments may comprise, consist essentially of, or consist of silicon dioxide. The insulative material 68 may comprise a same composition as the insulative material 58 (as shown), or may comprise a different composition relative to the insulative material 58. In some embodiments the insulative material 68 may be referred to as a second insulative material to distinguish it from the first insulative material 58. In some embodiments the assembly 10 may include the insulative material 60 (FIG. 8D) in addition to the insulative materials 58 and 68. In such embodiments the insulative materials 58, 68 and 60 may be referred to as first, second and third insulative materials to distinguish them from one another.

Figure 11A:
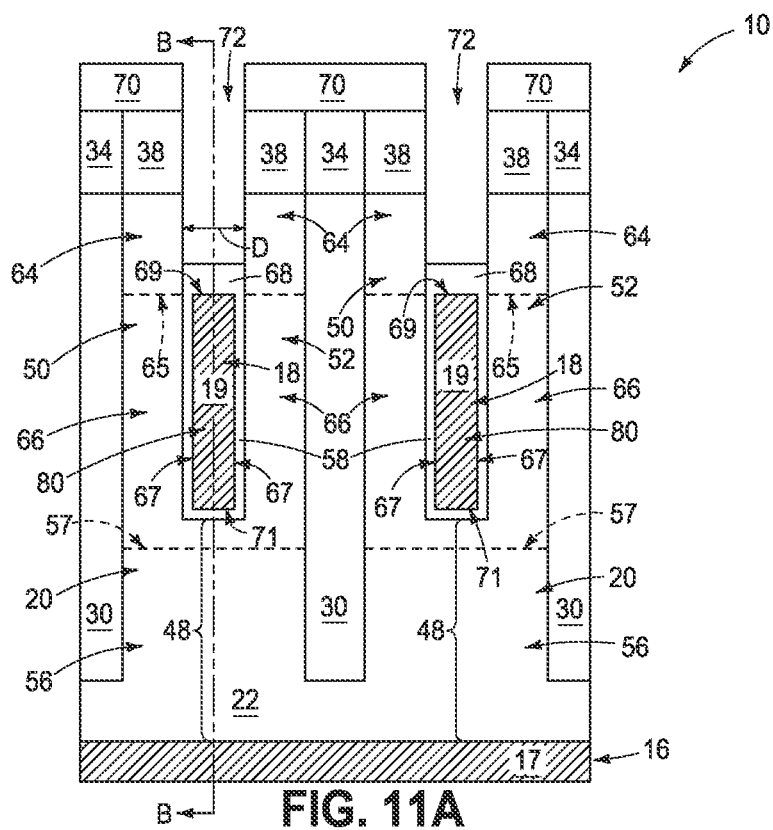
FIGS. 11A and 11B are diagrammatic cross-sectional side views of regions of the example integrated assembly of FIGS. 3A and 3B at an example process stage subsequent to that of FIGS. 10A and 10B. The view of FIG. 11A is along the line A-A of FIG. 11B, and the view of FIG. 11B is along the line B-B of FIG. 11A.
Figure 11B:
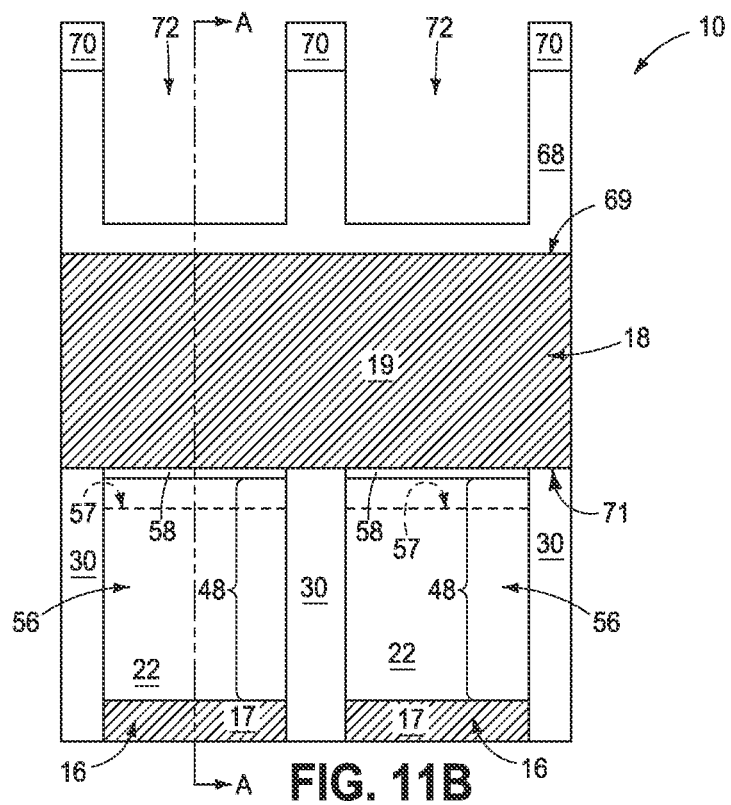

Referring to FIGS. 11A and 11B, the insulative material 68 is removed from over the materials 38 and 34 with a planarization process (e.g., CMP); and a patterned material 70 is formed over regions of the insulative material 68 and the materials 38 and 34. The patterned material 70 may comprise any suitable composition(s); and in some embodiments may comprise a combination of silicon and carbon (e.g., silicon carbide), and may be a same composition as the material 34. The material 70 may be patterned with any suitable process, including a so-called "pitch-doubling" process.

The patterned material 70 has openings 72 extending therethrough, with such openings being aligned with the digit lines 16.

The openings 72 are extended into the insulative material 68.

Figure 12A:
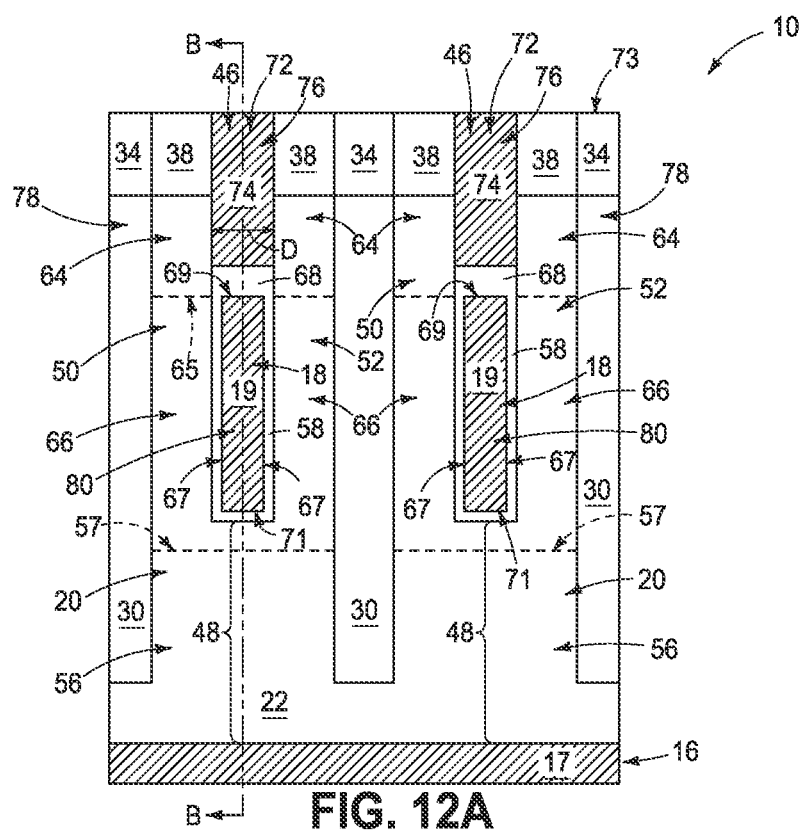
FIGS. 12A and 12B are diagrammatic cross-sectional side views of regions of the example integrated assembly of FIGS. 3A and 3B at an example process stage subsequent to that of FIGS. 11A and 11B. The view of FIG. 12A is along the line A-A of FIG. 12B, and the view of FIG. 12B is along the line B-B of FIG. 12A.
Figure 12B:
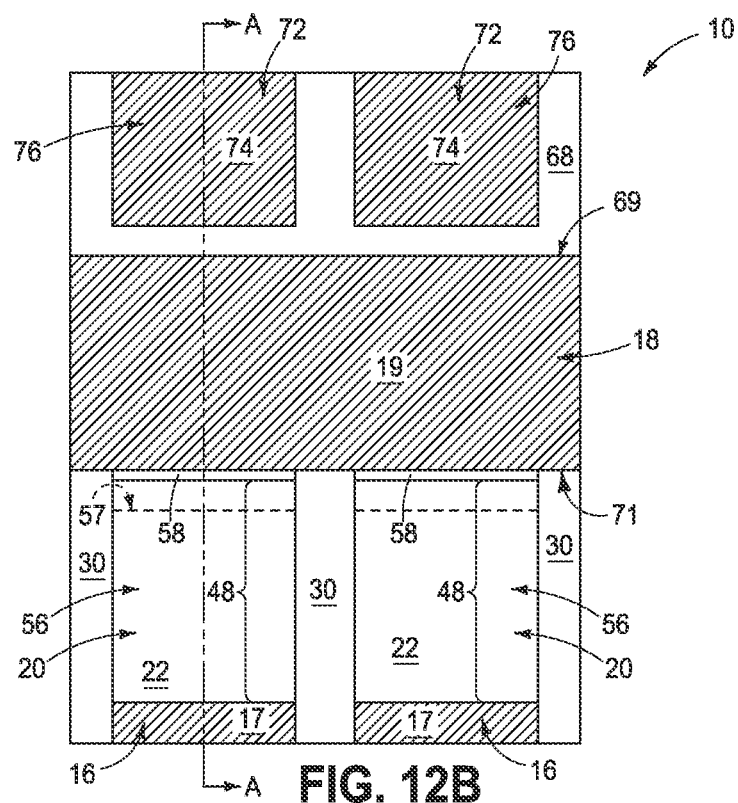

Referring to FIGS. 12A and 12B, conductive material 74 is formed within the openings 72. The conductive material 74 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments the conductive material 74 may comprise one or more metals (e.g., titanium, tungsten, etc.) and/or one or more metal-containing compositions (titanium nitride, tungsten nitride, titanium silicide, tungsten silicide, etc.).

In some embodiments the conductive material 74 may be provided to overfill the openings 72, and excess material 74 (together with the material 70) may be removed with a planarization process. A planarized surface 73 extends across the materials 34, 38 and 74.

The conductive material 74 of FIGS. 12A and 12B is patterned into conductive interconnects 76.

In some embodiments the slits 46 may be considered to have a first dimension, D, along the cross-section of FIG. 12A, and the conductive interconnects 76 may be considered to have a second dimension along the cross-section; with the second dimension being the same as the first dimension.

The pillars 20 may be considered to be incorporated into transistors 78. Each of the transistors has a lower source/drain region 56 electrically coupled with a digit line 16, and has an upper source/drain region 64 electrically coupled with a conductive interconnect 76. The transistors have conductive gates 80 between the vertically-extending segments 50 and 52 of the pillars 20. The gates 80 are operatively adjacent the channel regions 66 so that the gates may be utilized to impart electric fields on adjacent (associated) channel regions to couple source/drain regions 56 and 64 to one another through the channel regions. The gates 80 are along the wordlines 18, and electric fields imparted by the gates 80 may be controlled through operation of the wordlines 18.

In some embodiments the insulative material 58 between the gates 80 and the channel regions 66 may comprise ferroelectric material, and accordingly the transistors 78 may be ferroelectric transistors which may be utilized as memory cells within a memory array. In other embodiments the insulative material 58 between the gates 80 and the channel regions 66 may comprise non-ferroelectric material, and the transistors may be field effect transistors (FETs) utilized as access devices within a memory array. In such embodiments, storage-elements may be electrically coupled with the source/drain regions 64 through the interconnects 76.

Figure 13:
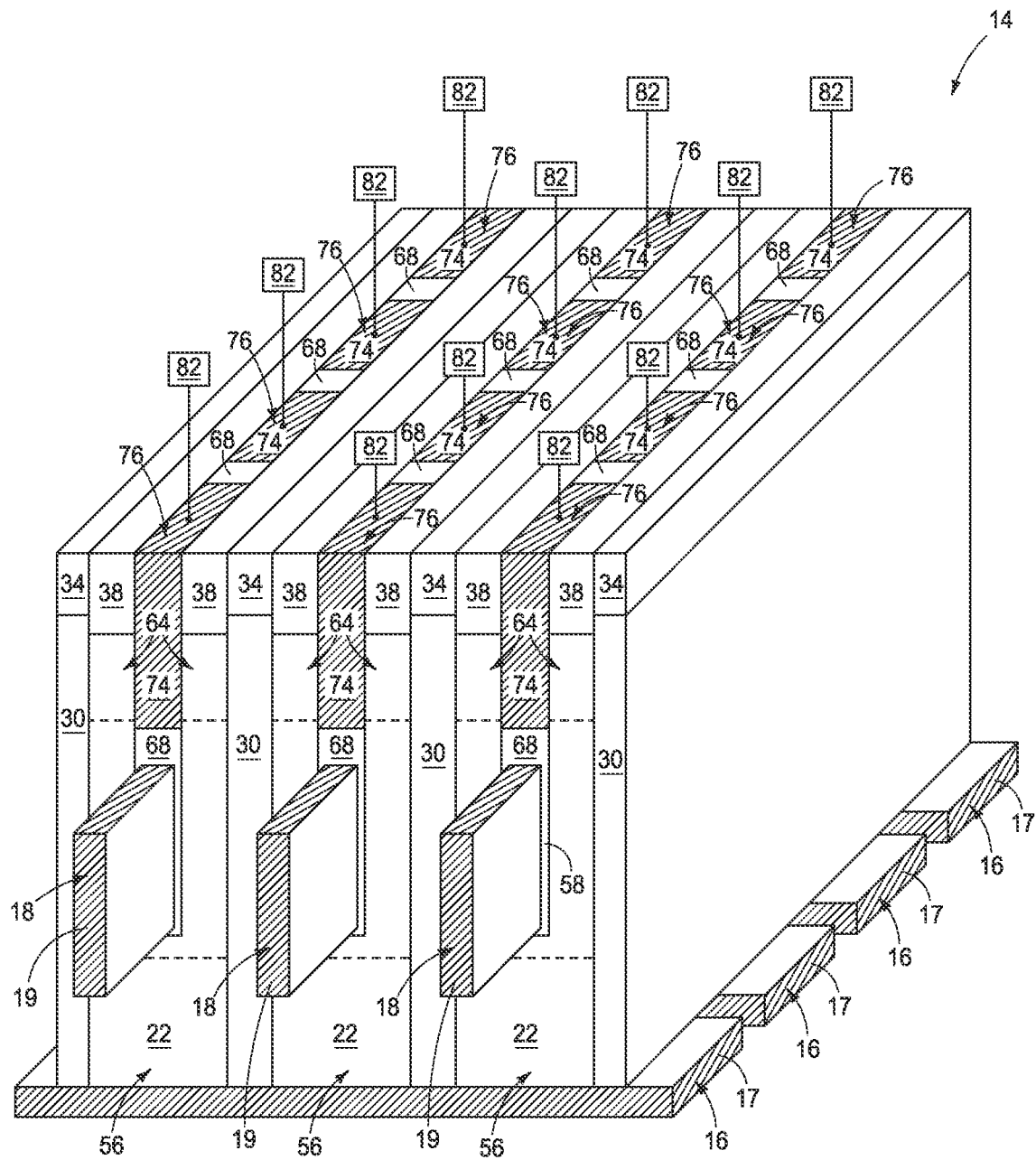
FIG. 13 is a diagrammatic three-dimensional view of a region of an example memory array.

FIG. 13 shows a three-dimensional view of a region of an example memory array 14, and shows the interconnects 76 electrically coupled with storage-elements 82. The storage-elements 82 may be any suitable devices having at least two detectable states; and in some embodiments may be, for example, capacitors, resistive-memory devices, conductive-bridging devices, phase-change-memory (PCM) devices, programmable metallization cells (PMC), etc.

Figure 14:
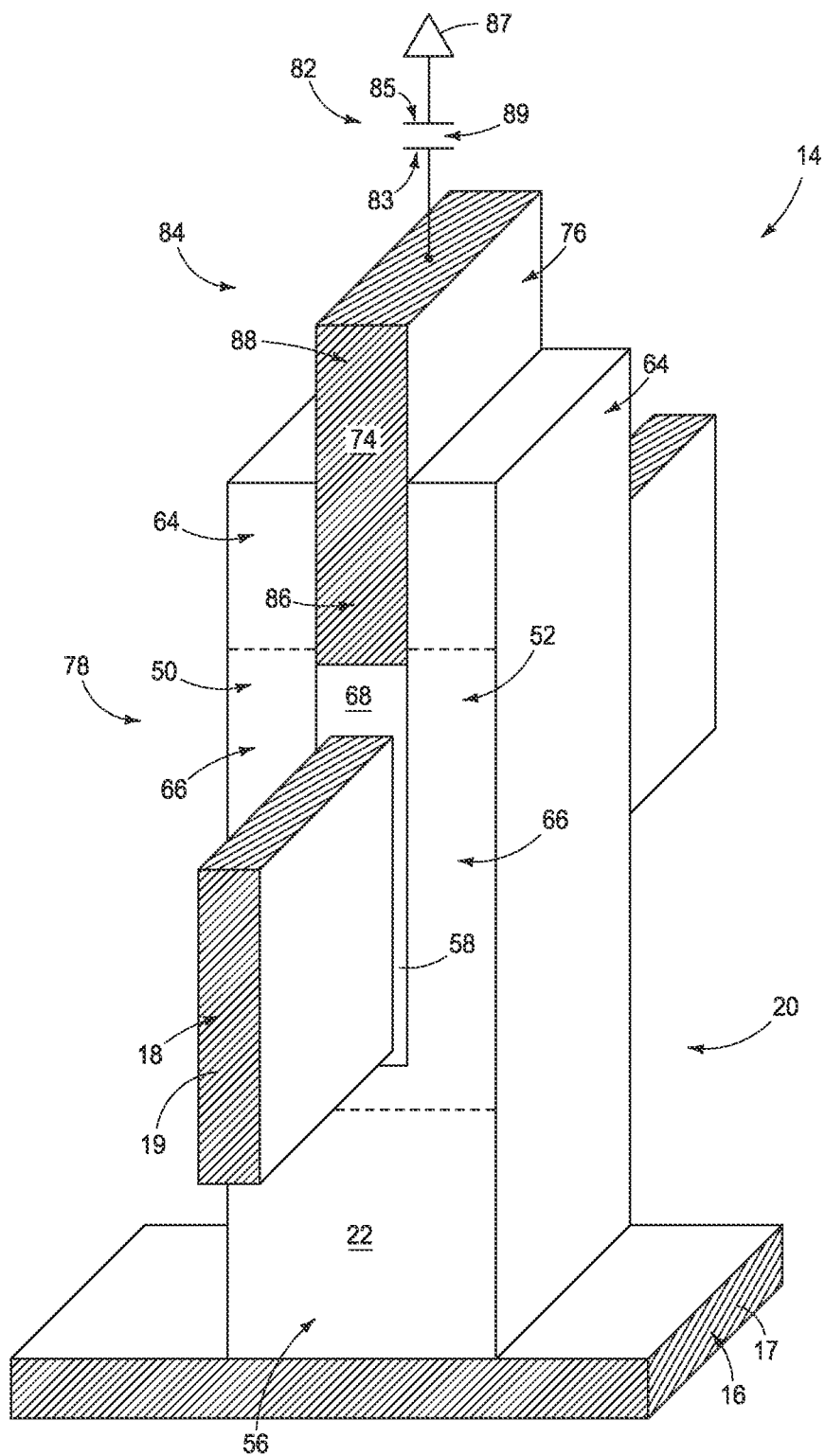
FIG. 14 is a diagrammatic three-dimensional view of an enlarged region of the memory array of FIG. 13.

FIG. 14 illustrates a region of the memory array 14 of FIG. 13, and shows an individual transistor 78. The transistor is incorporated into a memory cell 84 as an access transistor. The memory cell 84 has a storage-element 82 configured as a capacitor. The capacitor 82 has an electrode 83 which is electrically coupled with the interconnect 76, and has another electrode 85 which is electrically coupled with a reference voltage 87. The reference voltage 87 may be any suitable voltage including, for example, ground, VCC/2, etc.

The capacitor 82 also includes an insulative material 89 between the electrodes 83 and 85. The insulative material 89 may be ferroelectric material (e.g., may comprise any of the ferroelectric compositions described above as being suitable for utilization in the material 58), and may be utilized in a ferroelectric capacitor. Alternatively, the insulative material 89 may consist only of one or more non-ferroelectric compositions (e.g., silicon dioxide).

The view of FIG. 14 shows the interconnect 76 being directly over the digit line 16. In the illustrated embodiment the interconnect 76 is configured as a plate, and specifically is configured as a rectangular plate. A portion 86 of the rectangular plate is between the projections 50 and 52 of the semiconductor pillar 20, and another portion 88 is above the projections 50 and 52 of the semiconductor material pillar 20.

Figure 14A:
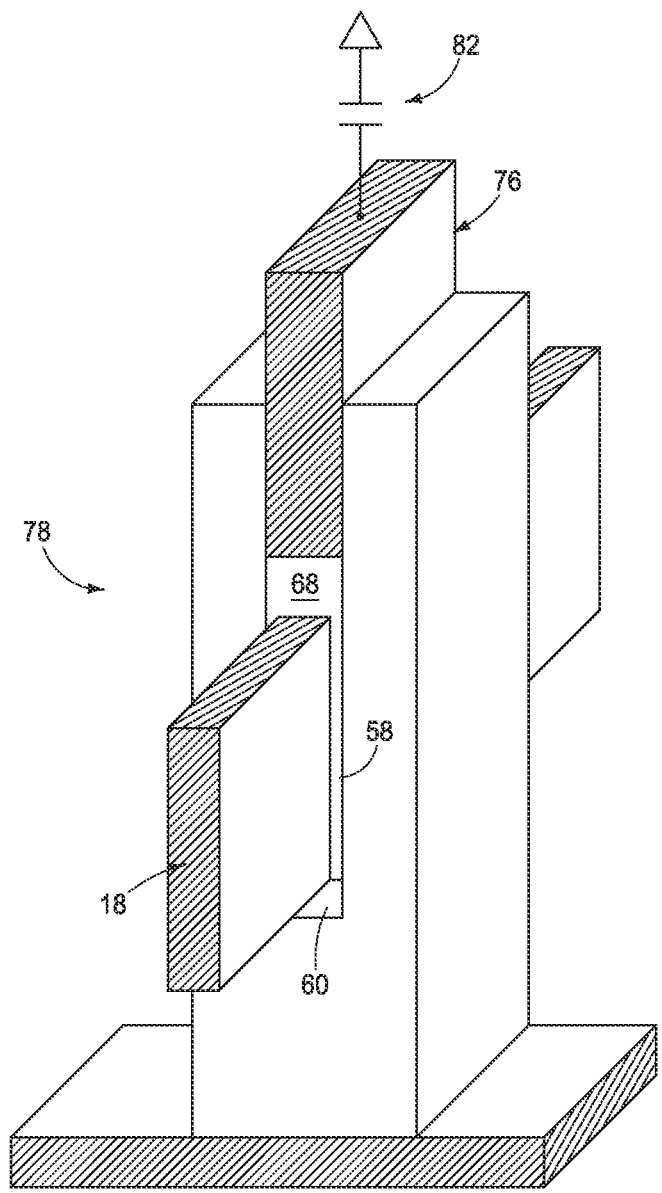
FIG. 14A is a diagrammatic three-dimensional view of a region of a memory array alternative to that of FIG. 14.
Figure 15:
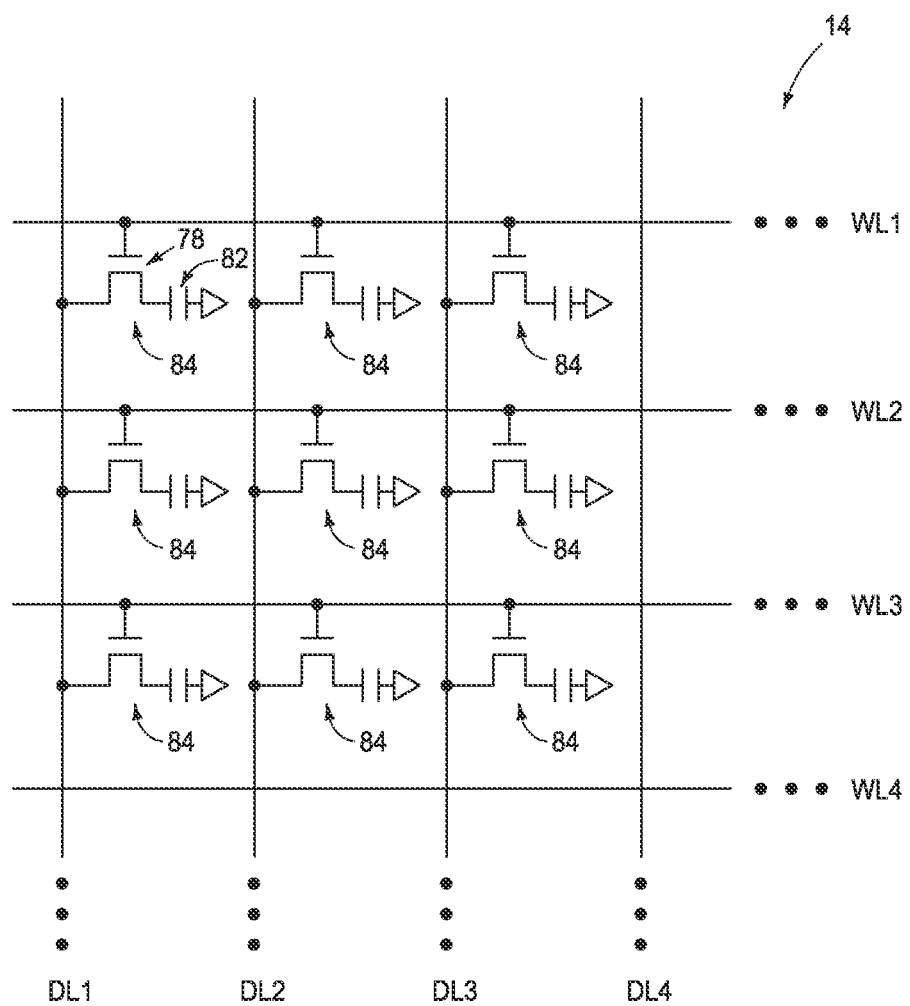
FIG. 15 is a diagrammatic schematic view of a region of an example memory array.

FIG. 14A shows a transistor 78 similar to that of FIG. 14, but in which the insulative material 60 described above with reference to FIG. 8D is provided under the wordline 18. To the extent that the transistors 78 described above are utilized as access transistors of a memory array, such memory array may have any suitable configuration. FIG. 15 shows a region of an example memory array 14 configured as a DRAM array utilizing one-transistor-one-capacitor (1T-1C) memory cells 84. The memory array 14 includes wordlines (WL1-WL4) extending along a first direction (row direction) of the memory array, and includes digit lines (DL1-DL4) extending along a second direction (column direction) of the memory array. Each of the memory cells 84 is uniquely addressed with a combination of one of the wordlines and one of the digit lines.

Figure 16:
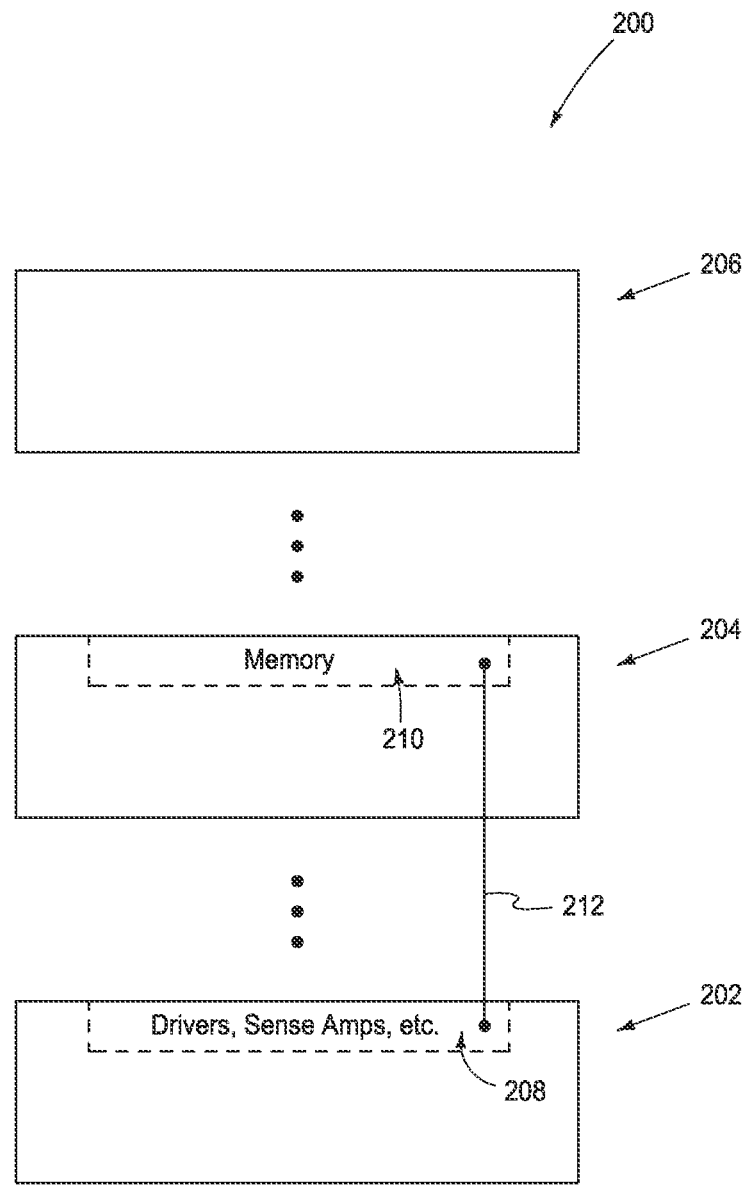
FIG. 16 is a diagrammatic cross-sectional side view of a region of an example assembly comprising stacked tiers.

In some embodiments the memory arrays (e.g., 14) may be within a memory tier (i.e., memory deck) which is within a vertically-stacked arrangement of tiers (or decks). The vertically-stacked arrangement may be referred to as a multitier assembly. FIG. 16 shows a portion of an example multitier assembly 200 comprising a vertically-stacked arrangement of tiers 202, 204 and 206. The vertically-stacked arrangement may extend upwardly to include additional tiers. The tiers 202, 204 and 206 may be considered to be examples of levels that are stacked one atop the other. The levels may be within different semiconductor dies, or at least two of the levels may be within the same semiconductor die.

The bottom tier 202 may include control circuitry and/or sensing circuitry 208 (e.g., may include drivers, sense amplifiers, etc.); and in some applications may comprise CMOS circuitry. The upper tiers 204 and 206 may include memory arrays, such as, for example, the memory arrays 14 described above; with an example memory array being shown as "memory" 210 within the tier 204.

The circuitry from the upper tiers may be electrically connected to the circuitry of the lower tiers through electrical interconnects. An example electrical interconnect 212 is shown electrically coupling the memory circuitry 210 from the tier 204 with the circuitry 208 of the tier 202. In some embodiments the interconnect 212 may connect digit lines from the memory circuitry 210 with sense amplifiers of the circuitry 208; may connect wordlines, mux lines and/or plate lines of the memory circuitry 210 with drivers of the circuitry 208; etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a pillar of semiconductor material. The pillar has a base region, and bifurcates into two segments which extend upwardly from the base region. The two segments are a first segment and a second segment, and are horizontally spaced from one another by an intervening region. A conductive gate is within the intervening region. A first source/drain region is within the base region, a second source/drain region is within the first and second segments, and a channel region is within the first and second segments. The channel region is adjacent to the conductive gate and is vertically disposed between the first and second source/drain regions.

Some embodiments include a memory array having digit lines which extend horizontally along a first direction. Pillars of semiconductor material extend upwardly from the digit lines. Wordlines passing through central regions of the pillars. The wordlines extend horizontally along a second direction which intersects the first direction. Each of the wordlines has a pair of opposing sidewall surfaces which extend between a top surface and a bottom surface. The semiconductor material of the pillars is along both of the opposing sidewall surfaces of said pair of opposing sidewall surfaces. First source/drain regions are within the pillars and are electrically coupled with the digit lines. Second source/drain regions are within the pillars and are vertically offset from the first source/drain regions. Channel regions are within the pillars, are adjacent the wordlines, and are vertically disposed between the first and second source/drain regions. Storage-elements are electrically coupled with the second source/drain regions.

Some embodiments include a method of forming an integrated assembly. An arrangement is formed to comprise semiconductor pillars extending upwardly from digit lines. The digits lines extend along a first direction. Slits are patterned to extend partially into the pillars. Each of the pillars has an associated one of the slits patterned therein and is configured to have a base region, and to have a pair of segments extending upwardly from the base region. The segments of said pair are spaced from one another by an intervening gap corresponding to said associated one of the slits. First insulative material is formed along sidewalls of the slits. Conductive wordlines are formed within the slits and adjacent the first insulative material. The conductive wordlines along a second direction which crosses the first direction. First source/drain regions are formed within the base regions of the pillars. Second source/drain regions are formed within the segments of the pillars, and are vertically spaced from the first source/drain regions by channel regions. Second insulative material is formed within the slits and over the wordlines. Conductive interconnects are formed within the slits and over the second insulative material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
    forming an arrangement to comprise semiconductor pillars extending upwardly from digit lines; the digits lines extending along a first direction;
    patterning slits to extend partially into the pillars; each of the pillars having an associated one of the slits patterned therein and being configured to have a base region, and to have a pair of segments extending upwardly from the base region, with the segments of said pair being spaced from one another by an intervening gap corresponding to said associated one of the slits;
    forming first insulative material along sidewalls of the slits;
    forming conductive wordlines within the slits, adjacent the first insulative material, and extending along a second direction which crosses the first direction;
    forming first source/drain regions within the base regions of the pillars;
    forming second source/drain regions within the segments of the pillars, and vertically spaced from the first source/drain regions by channel regions;
    forming second insulative material within the slits and over the wordlines; and
    forming conductive interconnects within the slits and over the second insulative material.

2. The method of claim 1 wherein the first and second insulative materials are a same composition as one another.

3. The method of claim 1 wherein the first and second insulative materials are not a same composition as one another.

4. The method of claim 1 wherein the first insulative material is formed along bottoms of the slits.

5. The method of claim 1 wherein the first insulative material is deposited.

6. The method of claim 1 wherein the first insulative material is oxidatively grown from semiconductor material of the semiconductor pillars.

7. The method of claim 1 further comprising forming spacers of third insulative material along bottoms of the slits prior to forming the conductive wordlines.

8. The method of claim 7 wherein the third insulative material is a different composition from the first insulative material.

9. The method of claim 7 wherein the third insulative material is a same composition as the first insulative material.

10. The method of claim 1 further comprising forming storage-elements electrically coupled with the conductive interconnects.

11. The method of claim 1 wherein the forming of the slits comprises:
    forming a mass to include the semiconductor pillars and to include one or more materials surrounding the semiconductor pillars;
    forming openings to extend into the mass, with the openings being over the semiconductor pillars and exposing top surfaces of the semiconductor pillars;
    forming a patterning material to extend conformally over the mass and into the openings, an upper topography of the patterning material having valleys over the semiconductor pillars;
    extending the valleys into the semiconductor pillars to form openings in the semiconductor pillars; and
    forming the slits to include the openings.

12. The method of claim 1 wherein each of the slits has a first dimension along a cross-section; and wherein each of the conductive interconnects has a second dimension along the cross-section, with the second dimension being the same as the first dimension.

13. A method of forming an integrated assembly, comprising:
    forming a semiconductor material over a digit line;
    patterning the semiconductor material to form a pillar of the semiconductor material; the pillar having a base region of the semiconductor material extending through insulative material, and bifurcating into two segments of the semiconductor material which extend upwardly from the base region; the two segments being a first segment and a second segment, and being horizontally spaced from one another by an intervening region, the first and second segments each comprising an interior sidewall along the intervening region and an opposing outer sidewall, the insulative material extending continuously along the base region and the outer sidewall of each of the first and second segments;

forming a conductive gate within the intervening region; and forming a first source/drain region within the base region, a second source/drain region within the first and second segments, and a channel region within the first and second segments; the channel region being adjacent the conductive gate and being vertically disposed between the first and second source/drain regions.

14. The method of claim 13 wherein the semiconductor material comprises silicon.

15. The method of claim 13 wherein the digit line is under the base region and electrically coupled with the first source/drain region, and further comprising forming a storage-element electrically coupled with the second source/drain region.

16. The method of claim 13 wherein the insulative material is a first insulative material and wherein the conductive gate comprises a top surface, a bottom surface, and sidewall surfaces extending between the top and bottom surfaces; and further comprising forming a second insulative material along the sidewall surfaces of the conductive gate.

17. The method of claim 16 wherein the second insulative material comprises ferroelectric material.

18. The method of claim 16 wherein the second insulative material does not comprise ferroelectric material.

19. The method of claim 16 wherein the second insulative material is also along the top surface of the conductive gate.

20. The method of claim 16 further comprising forming a third insulative material along the top surface of the gate, the third insulative material having a different composition than the second insulative material.

* * * * *